(12) United States Patent
Cordier et al.

(10) Patent No.: US 9,064,627 B2
(45) Date of Patent: Jun. 23, 2015

(54) INTEGRATED TRANSFORMER WITH MULTIPLE TRANSFORMATION RATIOS

(75) Inventors: Christophe Cordier, Anctoville (FR); Thomas Francois, Benouville (FR); Olivier Tesson, Bretteville L'orgueilleuse (FR)

(73) Assignees: ST-ERICSSON SA, Plan-les-Ouates (CH); ST-ERICSSON (FRANCE) SAS, Grenoble (FR)

( * ) Notice: Subject to any disclaimer, the term of this patent is extended or adjusted under 35 U.S.C. 154(b) by 498 days.

(21) Appl. No.: 13/500,679

(22) PCT Filed: Oct. 12, 2010

(86) PCT No.: PCT/EP2010/065274
§ 371 (c)(1),
(2), (4) Date: Apr. 6, 2012

(87) PCT Pub. No.: WO2011/045312
PCT Pub. Date: Apr. 21, 2011

(65) Prior Publication Data
US 2012/0194403 A1    Aug. 2, 2012

(30) Foreign Application Priority Data

Oct. 12, 2009 (FR) .................................... 09 57129

(51) Int. Cl.
*H03H 7/38*   (2006.01)
*H01F 19/04*  (2006.01)

(52) U.S. Cl.
CPC . *H01F 19/04* (2013.01); *H03H 7/38* (2013.01)

(58) Field of Classification Search
CPC ........................................................ H03H 7/38
USPC ............................................................ 333/33
See application file for complete search history.

(56) References Cited

U.S. PATENT DOCUMENTS 7,489,226 B1    2/2009  Chignola et al.
7,576,607 B2 *  8/2009  Lee et al. ..................... 330/195

FOREIGN PATENT DOCUMENTS

| CN | 101242159 A | 8/2008 |
| GB | 2 456 065 A | 7/2009 |

OTHER PUBLICATIONS

International Search Report issued in corresponding International application No. PCT/EP2010/065274, mailed Dec. 6, 2010.
Written Opinion of the International Searching Authority issued in corresponding International application No. PCT/EP2010/065274, mailed Dec. 6, 2010.
French Search Report issued in application No. FR 09 57129, on May 31, 2010.
Office Action in corresponding Chinese Patent Application No. CN 201080053684.1 issued on Dec. 19, 2013.

* cited by examiner

*Primary Examiner* — Stephen E Jones
(74) *Attorney, Agent, or Firm* — Patent Portfolio Builders PLLC

(57) ABSTRACT

The invention proposes a radio frequency circuit which comprises a transformer with a first primary circuit, a second primary circuit, and a secondary circuit, the secondary circuit comprising an integrated first inductor, this first inductor being positioned, on an axis orthogonal to a surface of the circuit, between an integrated second and third inductor respectively comprised in the first primary circuit and second primary circuit.

8 Claims, 3 Drawing Sheets

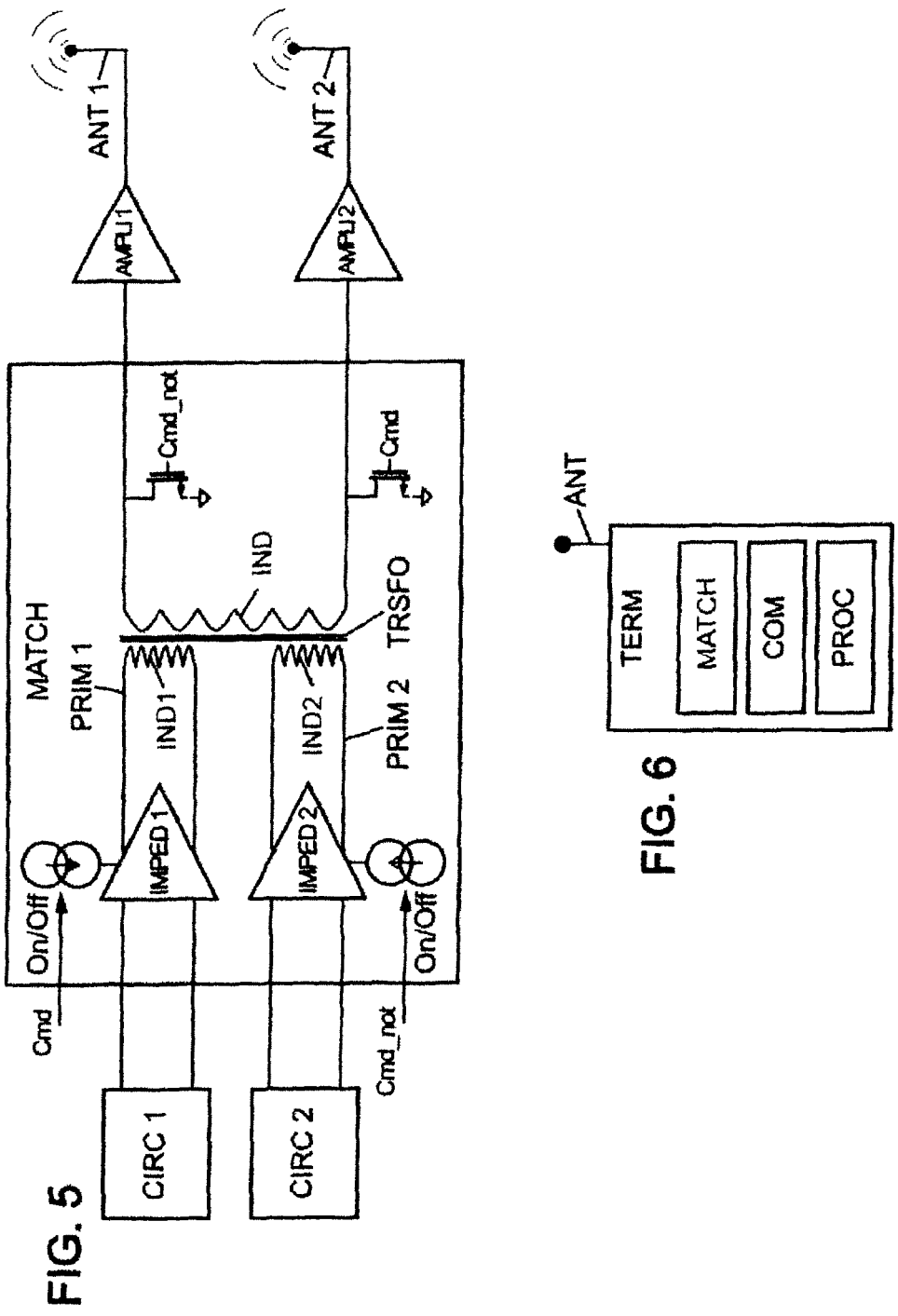

INTEGRATED TRANSFORMER WITH MULTIPLE TRANSFORMATION RATIOS

TECHNICAL FIELD

This invention relates to the transformers used in integrated electronic components.

More particularly, it concerns the transformers used in radio frequency (RF) integrated circuits.

TECHNOLOGICAL BACKGROUND

In order to linearize radio transmissions, radio frequency transmitters and receivers use differential architectures. Antennas, as well as the power amplifiers associated with them, do not have this differential structure, however. A transformation of the differential signals from communication circuits should therefore be performed before they are delivered to the power amplification stage and the antenna (antenna stage, for short).

The radio transmitters and receivers of today operate in different modes and on different frequency bands. In addition, transmitters and receivers currently have different outputs for various applications. For example, some devices can operate in compliance with different standards, and therefore have different antenna stages (for example operating in WCDMA and in GSM/EDGE).

Magnetic transformers are used to perform this transformation and also to match the output from these circuits to a particular antenna amplifier.

These transformers comprise inductors, and including these inductors in an integrated circuit requires a large silicon surface area.

A large amount of space is therefore consumed in the integrated circuit, as each antenna stage requires a circuit that has a transformer.

A prior art radio frequency circuit will now be described with reference to FIG. 1.

A matching circuit MATCH is positioned between two communication circuits CIRC1 and CIRC2 on the one hand and two antenna amplifiers AMPLI1 and AMPLI2 on the other hand. The antenna amplifiers APMLI1 and APMLI2 are respectively connected to the antennas ANT1, ANT2.

The circuit MATCH comprises two transformers TRSFO1 and TRSFO2, respectively coupled to the circuits CIRC1 and CIRC2.

The circuits CIRC1 and CIRC2 have a differential structure. The two outputs from each circuit are connected to the two terminals of the transformers' primary circuits. The transformers' secondary circuits have a terminal connected to the ground and a terminal connected to each of the amplifiers AMPLI1 and AMPLI2.

Two separate transformers are therefore used in this structure. Each of these transformers occupies space on the silicon substrate.

SUMMARY OF THE INVENTION

A need therefore exists for a radio frequency circuit which allows matching between a differential stage and a single input stage, and occupies a reduced silicon surface area.

A radio frequency circuit is proposed for this purpose, comprising a transformer with a first primary circuit, a second primary circuit, and a secondary circuit. The secondary circuit comprises a first integrated inductor which is positioned, on an axis orthogonal to a surface of the circuit, between a second integrated and a third inductors respectively comprised in the first primary circuit and second primary circuit.

The present invention takes advantage of the large number of layers in integrated circuits as they are currently produced.

For example, the circuit is a CMOS circuit.

In the present invention, different primary inductors are associated with the same secondary inductor.

This allows obtaining different transformation ratios on the surface area occupied by a single inductor.

For example, the inductors used are substantially flat and each is substantially comprised in a layer of the circuit.

When creating the inductor, it may be necessary to create a bridge on an adjacent layer in order to intersect two tracks of the inductor. Thus, "substantially comprised in a layer of the circuit" is understood to mean that the major portion of the inductor is located in a layer and that, for example, the parts acting as bridges are comprised in adjacent layers.

For example, the inductors comprise a given number of concentric turns.

The turns may be formed in the same layer of the circuit or in several layers of the circuit.

In addition, the turns may have different forms. For example, they may have a square, octagonal, circular, figure-eight, or other form.

In some embodiments, the transformer is positioned in a matching stage between a radio frequency circuit and an antenna.

There can be different transformation ratios for the different primary circuits. For example, the transformation ratios are obtained by creating the first and second inductors with a different number of turns.

The circuit of the invention can comprise more than two primary circuits for the same secondary circuit.

In some embodiments of the invention, the circuit comprises a control unit for the primary circuits. This control unit is configured to cause only one primary circuit to operate at a time.

For example, the control circuit allows choosing a transformation ratio. For example, the control unit comprises current-controlled variable impedance circuits or switches to electrically and selectively isolate one of the first and second primary circuits.

Another object of the invention is a communication terminal comprising a circuit of the invention.

The terminal has at least the same advantages as those provided by the circuit of the invention.

BRIEF DESCRIPTION OF DRAWINGS

Other features and advantages of the invention will be apparent from reading the following description. This description is purely illustrative and is to be read with reference to the attached drawings, in which, in addition to FIG. 1;

FIGS. 4 and 5 illustrate two control units according to two embodiments; and

FIG. 6 illustrates a terminal according to one embodiment.

DETAILED DESCRIPTION OF EMBODIMENTS

Figure 2:
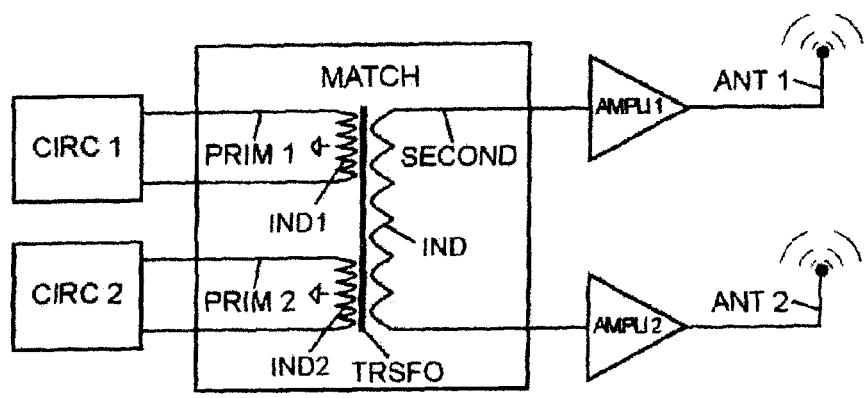
FIG. 2 illustrates a radio frequency circuit of one embodiment.

A radio frequency circuit according to one embodiment will now be described with reference to FIG. 2.

Figure 1:
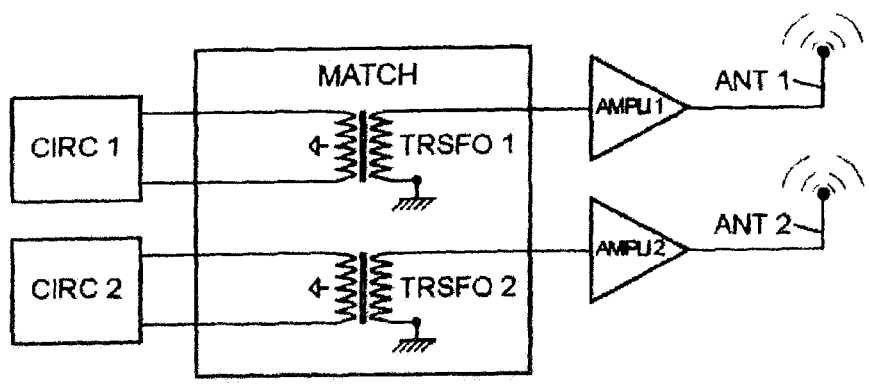

The structure in FIG. 2 reuses the elements CIRC1, CIRC2, AMPLI1, AMPLI2, ANT1, ANT2 of the circuit previously described with reference to FIG. 1.

In the present embodiment, the matching circuit MATCH, positioned between the circuits CIRC1 and CIRC2 and the amplifiers AMPLI1 and AMPLI2, comprises a transformer TRSFO which has a secondary circuit SECOND comprising an inductor IND with one terminal connected to the first amplifier AMPLI1 and the other terminal connected to the second amplifier AMPLI2. In addition, the transformer comprises two primary circuits PRIM1 and PRIM2 magnetically coupled to the secondary circuit SECOND. The primary circuits PRIM1 and PRIM2 respectively comprise the inductors IND1 and IND2. The two output terminals of the circuit PRIM1 are connected to the terminals of the circuit CIRC1 and the two terminals of the circuit PRIM2 are connected to the two output terminals of the circuit CIRC2.

It is therefore possible to make use of the primary circuit PRIM1 or the primary circuit PRIM2, depending on whether the antenna ANT1 or the antenna ANT2 is to be used. For example, a transformation ratio specific to PRIM1 or to PRIM2 is selected.

Figure 3:
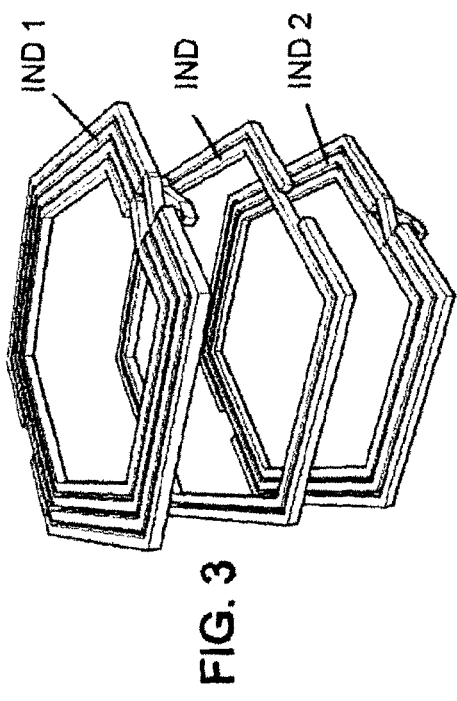
FIG. 3 schematically illustrates the arrangement of the inductors of a transformer of a circuit according to one embodiment.

The arrangement of the inductors IND1, IND2, and IND is now described with reference to FIG. 3.

The three inductors IND1, IND2, IND are represented in this Figure. These inductors are substantially flat inductors (in the sense indicated above), each comprising a given number of octagonal turns.

These inductors are created using integrated circuit etching processes known to a person skilled in the art, for example by photolithography.

In the example represented, the inductor IND comprised in the secondary circuit of the transformer is located between the coils IND1 and IND2 of the primary circuits PRIM1 and PRIM2. In addition, the inductors are concentrically arranged to ensure satisfactory magnetic coupling.

The inductor IND1 comprises four turns while the inductor IND2 comprises three. The circuits PRIM1 and PRIM2 therefore have different transformation ratios. The transformation ratio is the ratio of the number of turns in the secondary to the number of turns in the primary.

The turns of each of the inductors are mostly coplanar. These coplanar parts can therefore be in the same circuit layer. The inductors also comprise certain parts which form bridges between different turns. These bridge-forming parts may be comprised in layers adjacent to those which comprise the substantially coplanar turns.

Figure 4:
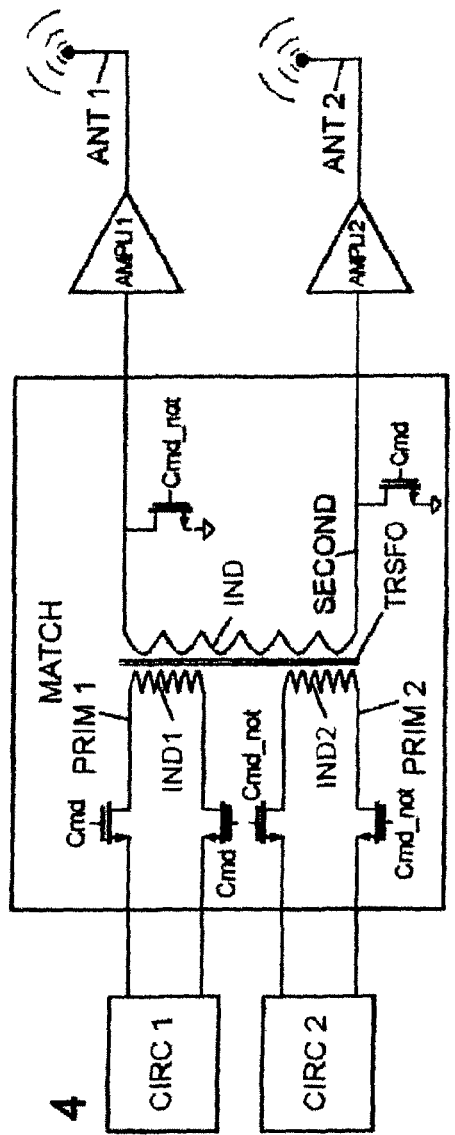

In the embodiment illustrated by FIG. 4, the circuit MATCH is controlled by means of a set of transistors.

These transistors are arranged so that they operate as switches on the branches of the circuits PRIM1, PRIM2 and SECOND. The transistors on the circuit PRIM1 and the transistor on the branch of the circuit SECOND coupled to the amplifier AMPLI2 are controlled by a signal Cmd. The other transistors are controlled by a signal Cmd_not which is the complement of the signal Cmd.

Thus, when the transistors controlled by the signal Cmd are passing current, the transistors controlled by the signal Cmd_not are not passing current.

The transistors coupled to the secondary circuit have their drain connected to the secondary and their source to the ground.

In this manner, it is possible to alternate between using the circuit PRIM1 to connect the circuit CIRC1 and the amplifier AMPL1, and using the circuit PRIM2 to connect the circuit CIRC2 with the amplifier AMPL2.

To connect CIRC1 to AMPLI1, the signal Cmd is activated which enables the transistors controlled by this signal to pass current. In this case the circuit PRIM1 closes, the secondary branch connected to AMPLI2 goes to the ground, and the transistor on the secondary branch connected to AMPLI1 does not pass current.

Symmetrically, to connect CIRC2 to AMPLI2, the signal Cmd is deactivated which enables the transistors controlled by the signal Cmd_not to pass current. In this case the circuit PRIM1 opens and the circuit CIRC2 closes, the secondary branch connected to AMPLI1 goes to the ground, and the transistor on the secondary branch connected to AMPLI2 does not pass current.

In the embodiment illustrated in FIG. 5, the transistors on the circuits PRIM1 and PRIM2 have been replaced by two variable impedance circuits IMPED1 and IMPED2.

Each of these circuits is controlled by a current source, which itself is controlled by the signal Cmd for the current source controlling the circuit IMPED1, and the signal Cmd_not for the current source controlling the circuit IMPED2.

For example, the circuits IMPED1 and IMPED2 are operational amplifiers. The current sources are coupled to the amplifiers to obtain an output impendence of the operational amplifiers which is zero or infinite (theoretically).

As will be apparent to a person skilled in the art, the operation of this control circuit is inferred from that of the circuit described with reference to FIG. 4.

A communication terminal according to an embodiment of the invention is now described with reference to FIG. 6.

The terminal TERM comprises a processing unit PROC for controlling the terminal. The terminal additionally comprises a communication unit COM and an antenna ANT for communication purposes. The terminal additionally comprises a matching circuit MATCH comprising a circuit of the invention.

Of course, the invention is not limited to the embodiments described above. It extends to all equivalent variations.

The invention claimed is:

1. An integrated radio frequency circuit, comprising: a transformer (TRSFO) with a first primary circuit (PRIM1), a second primary circuit (PRIM2), and a secondary circuit, the secondary circuit (SECOND) comprising a first integrated inductor (IND), said first inductor being positioned, on an axis orthogonal to a surface of the circuit, between a second (IND1) and a third (IND2) integrated inductors respectively comprised in the first primary circuit and the second primary circuit, and wherein the circuit is multilayer and the first, second, and third inductors are substantially flat, and wherein each of these inductors is substantially comprised in one respective layer of the radio frequency circuit only.

2. The circuit according to claim 1, wherein the inductors comprise a given number N of concentric turns, where N is an integer greater than 1.

3. The circuit according to claim 1, wherein the transformer is positioned in a matching stage (MATCH) of the radio frequency circuit so as to perform matching between the radio frequency circuit and at least one antenna (ANTI, ANT2).

4. The circuit according to claim 1, wherein the first and second primary circuits have different transformation ratios.

5. The circuit according to claim 1, additionally comprising a control unit for the first and second primary circuits, said control unit being configured to cause only one primary circuit, from among the first and second primary circuits, to operate at a time.

6. A communication terminal (TERM) comprising:
a communication unit (COM); and
at least one antenna (ANT);
wherein the terminal additionally comprises:
a matching circuit (MATCH) according to claim 1 between the communication unit and the at least one antenna.

7. Circuit according to claim 5, wherein the control unit comprises switches for electrically and selectively isolating one of the first and second primary circuits.

8. Circuit according to claim 5, wherein the control unit comprises current-controlled variable impedance circuits for electrically and selectively isolating one of the first and second primary circuits.

\* \* \* \* \*